United States Patent
Yasui et al.

(10) Patent No.: US 10,083,948 B2
(45) Date of Patent: Sep. 25, 2018

(54) SEMICONDUCTOR DEVICE, METHOD FOR MANUFACTURING SAME, AND SEMICONDUCTOR MODULE

(71) Applicant: Hitachi, Ltd., Chiyoda-ku, Tokyo (JP)

(72) Inventors: Kan Yasui, Tokyo (JP); Kazuhiro Suzuki, Tokyo (JP); Takafumi Taniguchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/539,447

(22) PCT Filed: Dec. 26, 2014

(86) PCT No.: PCT/JP2014/084456
§ 371 (c)(1),
(2) Date: Jun. 23, 2017

(87) PCT Pub. No.: WO2016/103434
PCT Pub. Date: Jun. 30, 2016

(65) Prior Publication Data
US 2017/0352648 A1    Dec. 7, 2017

(51) Int. Cl.
*H01L 23/28* (2006.01)
*H01L 25/18* (2006.01)
(Continued)

(52) U.S. Cl.
CPC .............. *H01L 25/18* (2013.01); *H01L 23/28* (2013.01); *H01L 24/05* (2013.01); *H01L 25/07* (2013.01);
(Continued)

(58) Field of Classification Search
CPC ............................ H01L 23/5329; H01L 25/18
See application file for complete search history.

(56) References Cited

U.S. PATENT DOCUMENTS

| 6,437,432 B2* | 8/2002 | Ikumo | H01L 23/522 257/691 |
| 2003/0094621 A1* | 5/2003 | Teramae | H01L 23/3185 257/99 |

(Continued)

FOREIGN PATENT DOCUMENTS

| JP | 2007-201247 A | 8/2007 |
| JP | 2013-191716 A | 9/2013 |

OTHER PUBLICATIONS

International Search Report (PCT/ISA/210) issued in PCT Application No. PCT/JP2014/084456 dated Mar. 24, 2015 with English-language translation (three (3) pages).
(Continued)

*Primary Examiner* — Sitaramarao S Yechuri
(74) *Attorney, Agent, or Firm* — Crowell & Moring LLP

(57) ABSTRACT

In order to form, in a wide band gap semiconductor device, a high field resistant sealing material having a large end portion film thickness, said high field resistant sealing material corresponding to a reduced termination region having a high field intensity, and to improve accuracy and shorten time of manufacturing steps, this semiconductor device is configured as follows. At least a part of a cross-section of a high field resistant sealing material formed close to a termination region at the periphery of a semiconductor chip has a perpendicular shape at a chip outer peripheral end portion, said shape having, on the chip inner end side, a film thickness that is reduced toward the inner side. In a semiconductor device manufacturing method for providing such semiconductor device, the high field resistant sealing material is formed in a semiconductor wafer state, then, heat treatment is performed, and after dicing is performed, a chip is mounted.

13 Claims, 18 Drawing Sheets

(51) Int. Cl.
  *H01L 25/07* (2006.01)
  *H01L 29/78* (2006.01)
  *H01L 29/872* (2006.01)
  *H01L 23/00* (2006.01)

(52) U.S. Cl.
  CPC ............ *H01L 29/78* (2013.01); *H01L 29/872* (2013.01); *H01L 2224/04042* (2013.01); *H01L 2224/06181* (2013.01); *H01L 2224/4847* (2013.01); *H01L 2224/48227* (2013.01); *H01L 2224/4917* (2013.01); *H01L 2224/49111* (2013.01); *H01L 2224/73265* (2013.01); *H01L 2224/92247* (2013.01); *H01L 2224/94* (2013.01); *H01L 2924/0002* (2013.01); *H01L 2924/10272* (2013.01)

(56) References Cited

U.S. PATENT DOCUMENTS

2007/0152320 A1* 7/2007 Yamagata ......... H01L 23/49816
   257/701
2016/0172437 A1* 6/2016 Masuda ............. H01L 29/0619
   257/494

OTHER PUBLICATIONS

Japanese-language Written Opinion (PCT/ISA/237) issued in PCT Application No. PCT/JP2014/084456 dated Mar. 24, 2015 (three (3) pages).

* cited by examiner

SEMICONDUCTOR DEVICE, METHOD FOR MANUFACTURING SAME, AND SEMICONDUCTOR MODULE

TECHNICAL FIELD

The present invention relates to a semiconductor device and a method for manufacturing the same, and particularly to a power semiconductor device and a method for manufacturing the same using silicon and silicon carbide as raw materials.

BACKGROUND ART

Among power conversion apparatuses represented by an inverter, a power semiconductor is used as a major component having rectification and switching functions. Although silicon is currently the mainstream as a material for the power semiconductor, development aimed at adoption of silicon carbide (SiC) excellent in physical properties is proceeding.

Conventionally, techniques for improving reliability of a semiconductor device using SiC includes a technique in which a highly electric field resistant sealing material is inserted between a silicone gel sealing material and a semiconductor to suppress electric field intensity in silicone gel in the vicinity of a termination region of an SiC chip within a range of an electric field resistance (see, for example, PTL 1).

CITATION LIST

Patent Literature

PTL 1: Japanese Patent Application Laid-Open No. 2013-191716

SUMMARY OF INVENTION

Technical Problem

Since dielectric breakdown field intensity of SiC is one order of magnitude higher than that of silicon and accordingly the SiC is suitable for high voltage applications, and thermal conductivity of the SiC is also three times that of the silicon and properties of a semiconductor is hard to be lost even at a high temperature, the SiC is in principle resistant to temperature rise and can lower resistance of an element. Therefore, the SiC is suitable as a material for a power semiconductor.

Particularly, development of an SiC hybrid module is preceded in which a reflux diode (freewheeling diode) of a rectifying element is replaced from silicon to the SiC, between a switching element and the rectifying element of a power module constituting an inverter. The reason is that a structure and operation of the rectifying element are simpler than those of the switching element and development of the element can be easily proceeded, and that a merit that switching loss can be greatly reduced is clear. In recent years, development of a full SiC module is also proceeding in which the switching element is also replaced with the SiC, and it is becoming possible to further reduce the loss.

There is a report that the switching loss decreases to one tenth since there is no recovery current in an SiC hybrid module in which a silicon PN diode is replaced with an SiC schottky barrier diode (SBD). This is because a minority carrier accumulated during switching flows as a recovery current in the PN diode of a bipolar element, while there is no minority carrier accumulated in the SBD of a unipolar element.

In a case where the full SiC module in which a silicon IGBT (hereinafter Si-IGBT) is replaced with an SiC metal oxide semiconductor (MOS) in the switching element as well as in the rectifying element is used, an effect of reducing the loss is further increased. This is because, by replacing the Si-IGBT of the bipolar element with the SiC-MOS of the unipolar element, the switching loss can be reduced on the same principle as in a case where the silicon PN diode is replaced with the SBD of the SiC. In the full SiC module, there is also a scheme in which the SBD is omitted and an MOS side has the rectification function.

Note that, although silicon can be used for manufacturing the SBD and the MOS, use of silicon is not practical because resistance is increased as a thickness of a body layer is increased to increase a withstand voltage. By using the SiC having low resistance, the SBD or MOS of the unipolar element can be applied up to a high withstand voltage region where a silicon SBD or MOS having a withstand voltage such as 600 V to 3.3 kV could not be applied conventionally.

Since the SiC has the dielectric breakdown field intensity as described above, the SiC can be designed to increase electric field intensity inside a chip, and can reduce an electric field relaxation region (termination region) around the chip to reduce area cost. At this time, since electric field intensity applied to a sealing material of a package contacting the SiC is also increased, high dielectric breakdown intensity is required for a sealing material for the SiC. A method for inserting a highly electric field resistant sealing material is disclosed (PTL 1), in which a highly electric field resistant sealing material is inserted between a silicone gel sealing material and a semiconductor since in a case where silicon is used, for example, sealing is performed immediately above the termination region of the chip with silicone gel or the like after the chip is mounted, while in a case where SiC is used, electric field intensity exceeds electric field resistance (dielectric breakdown field intensity) of the silicone gel. According to this method, since the electric field intensity in the silicone gel in the vicinity of the termination region of the SiC chip can be suppressed within a range of the electric field resistance, reliability of the semiconductor device using the SiC can be improved.

However, in the method described in PTL 1, there have been problems below in a technique for relaxing the electric field intensity in the sealing material in the vicinity of the termination region of the chip.

A first problem is caused by a shape of the highly electric field resistant sealing material at a chip end portion. This will be described with reference to FIGS. 2 and 3. FIG. 2 is a top view of one of SiC chips constituting a power semiconductor module using SiC, and FIG. 3 is a cross-sectional view. FIGS. 4a and 4b illustrate the SiC chip of FIGS. 2 and 3 on which a formation region 30 of the highly electric field resistant sealing material is overlaid. FIG. 4a is a top view of the SiC chip, and FIG. 4b is a cross-sectional view of the SiC chip. FIGS. 2, 3, 4a and 4b illustrate the chip of a diode, and a termination region 32 is provided around an electrode 31, and a highly electric field resistant sealing material 34 is disposed to relax an electric field of the termination region contacting an upper surface of the chip. In the prior art, a formation step of a highly electric field resistant sealing material is performed in a state where a chip is mounted on an insulating substrate. FIG. 5 illustrates a partial cross-section of a state where a chip is mounted on an insulating substrate 22 using a solder 35, a wire 13 is bonded to the chip, and the chip is covered with gel 36 as a sealing material. In FIG. 5, which is an enlarged view of the cross-section of the chip, an end portion 38 of the highly electric field resistant sealing material has a tapered shape with trailing due to a formation method in a coating technique. As a result, there is a problem that a film thickness is small particularly in the vicinity of a chip outer peripheral portion so that the electric field from the SiC cannot be sufficiently relaxed. In a case where a width 39 of the termination region is designed to be sufficiently wide, the electric field at this part is relaxed. In that case, however, the termination region which hardly contributes to electric conduction is widened on the expensive SiC chip, which causes cost increase. To make use of excellent material physical properties of the SiC, a method capable of increasing the film thickness at the chip end portion of the highly electric field resistant sealing material is required so that the electric field at the end portion can be relaxed even in a case where the termination region is reduced.

A second problem is due to lack of production turnaround time (TAT) and coating accuracy. FIG. 6 illustrates a flow of a coating step of a highly electric field resistant sealing material in the prior art. A coating step 40 of the highly electric field resistant sealing material is arranged after a bonding step 41 of the chip to the insulating substrate. A state of the coating step 40 is illustrated in FIG. 7. The highly electric field resistant sealing material 34 is coated by a dispenser or the like to surround the termination region 32 of an SiC-SBD chip 12 soldered on the insulating substrate 22. It is necessary to repeatedly perform coating on all chips mounted on the insulating substrate while aligning a horizontal position and a height of a coating nozzle 42 for each of the chips on the insulating substrate, and thus a time is required for a production step. The production step is one of the steps requiring a time because curing heat treatment is also required to be performed on the highly electric field resistant sealing material after the coating, and at this time, heat treatment is required to be performed on each insulating substrate for several hours.

In addition, although the each chip is soldered on the insulating substrate, alignment of the each chip is delicately shifted because solder liquefies during reflow to cause thickness variation, horizontal movement, and rotation. There is a problem that, although the dispenser has a function to optically recognize and perform correction of a chip position, coating accuracy of the dispenser tends to be lowered, and a trade-off is caused in which coating time increases in a case where accuracy is improved.

In addition, such problems are common to semiconductor devices using wide band gap semiconductors such as GaN and diamond, which have high dielectric breakdown field intensity, as well as the SiC.

In view of the above problems, the inventors have proposed a new structure of a semiconductor device and a method for manufacturing the same, which will be described below.

Solution to Problem

A semiconductor device of the present invention includes, for example, a semiconductor chip in which a wide gap semiconductor element is formed, wherein a cross-sectional shape of a highly electric field resistant sealing material formed in a peripheral portion of the semiconductor chip at a pattern surface side of the chip has at least in part an end face shape perpendicular or substantially perpendicular at a chip outer peripheral end side, and a shape in which a film thickness decreases toward an inside at a chip inner peripheral end side.

In addition, a method for manufacturing a semiconductor device of the present invention includes, for example, a semiconductor chip in which a wide gap semiconductor element is formed, the method including the steps of: forming a highly electric field resistant sealing material disposed in a peripheral portion of the semiconductor chip at a pattern surface side of the chip in a semiconductor wafer state; performing heat treatment on the semiconductor wafer; and performing dicing on the heat-treated semiconductor wafer.

In addition, a semiconductor module of the present invention includes, for example, a semiconductor chip in which a wide gap semiconductor element is formed, wherein, in the semiconductor chip, a cross-sectional shape of a highly electric field resistant sealing material formed in a peripheral portion of the semiconductor chip at a pattern surface side of the chip has at least in part an end face shape perpendicular or substantially perpendicular at a chip outer peripheral end side, and a shape in which a film thickness decreases toward an inside at a chip inner peripheral end side.

Advantageous Effects of Invention

According to the present invention, also in a high electric field region in the vicinity of a chip of a wide band gap semiconductor having high dielectric breakdown intensity, it is possible to relax electric field intensity so as not to exceed dielectric breakdown field intensity of a sealing material such as silicone gel sealing the chip, and accordingly possible to improve reliability of a semiconductor device and a semiconductor module.

DESCRIPTION OF EMBODIMENTS

Figure 1:
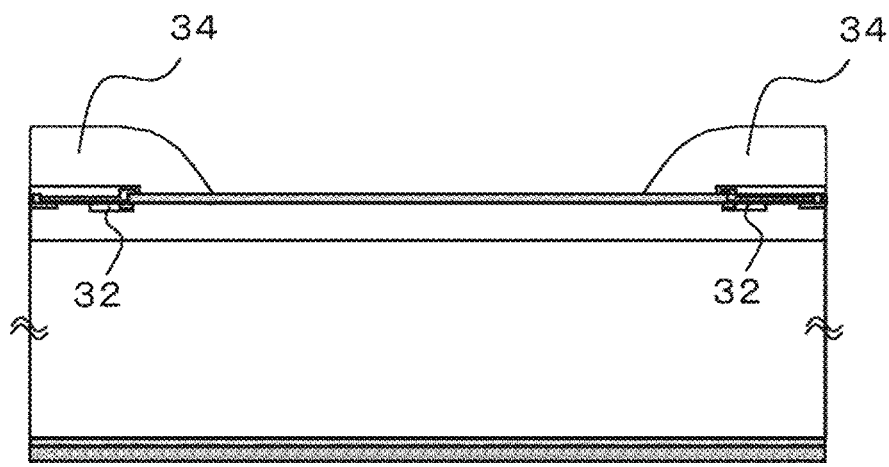
FIG. 1 is a cross-sectional view illustrating a semiconductor device according to a first embodiment which is one representative embodiment of the present invention.

According to the present invention, in a wide band gap semiconductor device, a cross-section of a highly electric field resistant sealing material formed in the vicinity of a termination region around a chip has at least in part a perpendicular shape at a chip outer peripheral end portion, and a film thickness decreases toward an inside at a chip inner end side.

The highly electric field resistant sealing material including one or a plurality of polyamide imide resin, polyether amide imide resin, and polyether amide resin is used.

In addition, to realize the above structure, in a manufacturing method, a highly electric field resistant sealing material to be disposed in the vicinity of a termination region around a chip is formed in a semiconductor wafer state, heat treatment and dicing are performed, and then the chip is mounted.

Here, in the manufacturing method of the present invention, in which the highly electric field resistant sealing material is formed before the chip is mounted, high-temperature heat treatment in a chip mounting step is also applied to the highly electric field resistant sealing material. To prevent problems caused by degassing from the highly electric field resistant sealing material generated during the high-temperature heat treatment, additional heat treatment is performed at a higher temperature, desirably in the range of 200° C. to 360° C., in addition to ordinary curing heat treatment performed after formation of the highly electric field resistant sealing material. As a result, it is possible to realize the manufacturing method of the present invention having a feature of exchanging a formation step of the highly electric field resistant sealing material and the chip mounting step.

In the wide band gap semiconductor device provided by the present invention, even in a high electric field region in the vicinity of the chip of the wide band gap semiconductor having high dielectric breakdown intensity, it is possible to relax electric field intensity so as not to exceed dielectric breakdown field intensity of a sealing material such as silicone gel sealing the chip, and accordingly to improve reliability.

Particularly, since the film thickness of the highly electric field resistant sealing material at the chip outer peripheral end portion can be formed thick, the wide band gap semiconductor device can correspond to a termination structure having high area efficiency with reduced design so as to have a high electric field up to the chip end portion, which can reduce chip area and a cost.

In addition, in the manufacturing method of the present invention, the highly electric field resistant sealing material is collectively formed not at a stage of an individual chip after being mounted but at a stage of the semiconductor wafer, and therefore TAT in the manufacturing step can be reduced. At the same time, by forming the highly electric field resistant sealing material in the semiconductor wafer state in which chips are mounted at regular intervals and having uniform inclination, accuracy of the formation step or a test step of the highly electric field resistant sealing material can also be improved. Accordingly, it is possible to reduce a disposal cost due to defective formation, simplify the test step, and lower a cost of manufacturing apparatus like a dispenser and so on.

A supplementary explanation will be given on the test step. Another effect of the present invention is that a withstand voltage can be tested easily on the wafer by forming the highly electric field resistant sealing material in the wafer state. Conventionally, in a case where the withstand voltage is tested without using a sealing material, aerial discharge is caused exceeding a withstand voltage in air when a high voltage is applied. Therefore, special incidental facilities to prevent discharge by dropping fluorinert or locally raising atmospheric pressure have been necessary. According to the present invention, it is possible to simplify and accelerate the test step without providing the incidental facilities and the like.

Hereinafter, embodiments of the present invention will be described in detail for each embodiment with reference to the drawings.

First Embodiment

As a first embodiment of the present invention, a structure of a semiconductor module (SiC hybrid module) and a method for manufacturing the same will be described, the semiconductor module including Si-IGBTs as a switching element group and SiC-SBDs as a diode element group, the Si-IGBTs and the SiC-SBDs having a withstand voltage of 3.3 kV and a current capacity of 1200 A, being mounted on the semiconductor module.

Figure 2:
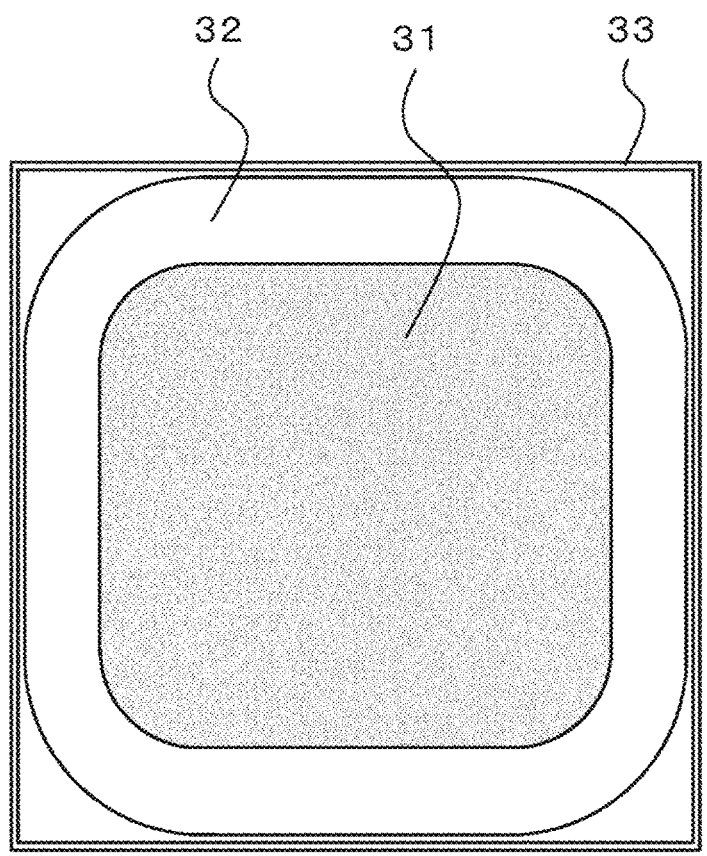
FIG. 2 is a top view of an SiC chip.
Figure 3:
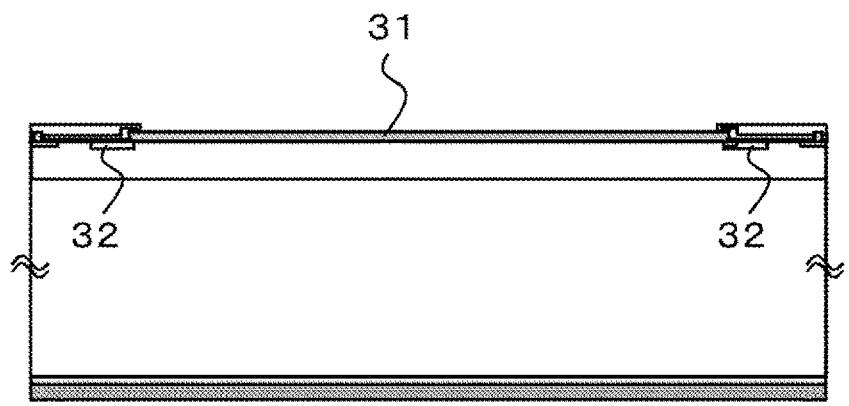
FIG. 3 is a cross-sectional view of the SiC chip.
Figure 4A:
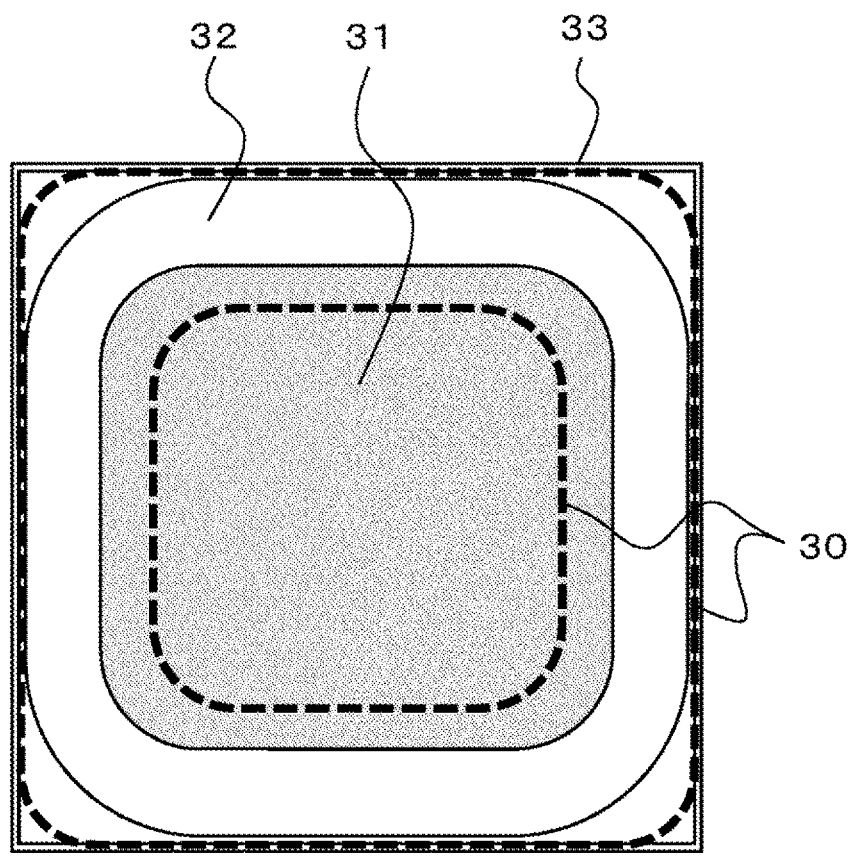
FIG. 4A is a top view of the SiC chip on which a formation region of a highly electric field resistant sealing material is overlaid.
Figure 4B:
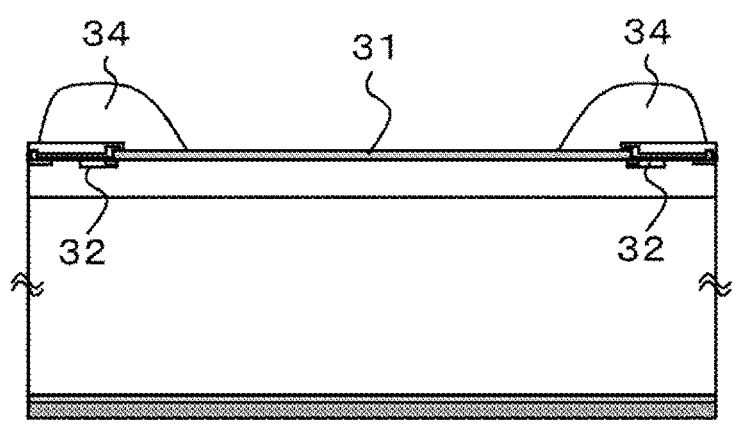
FIG. 4B is a cross-sectional view of the SiC chip on which the formation region of the highly electric field resistant sealing material is overlaid.
Figure 5:
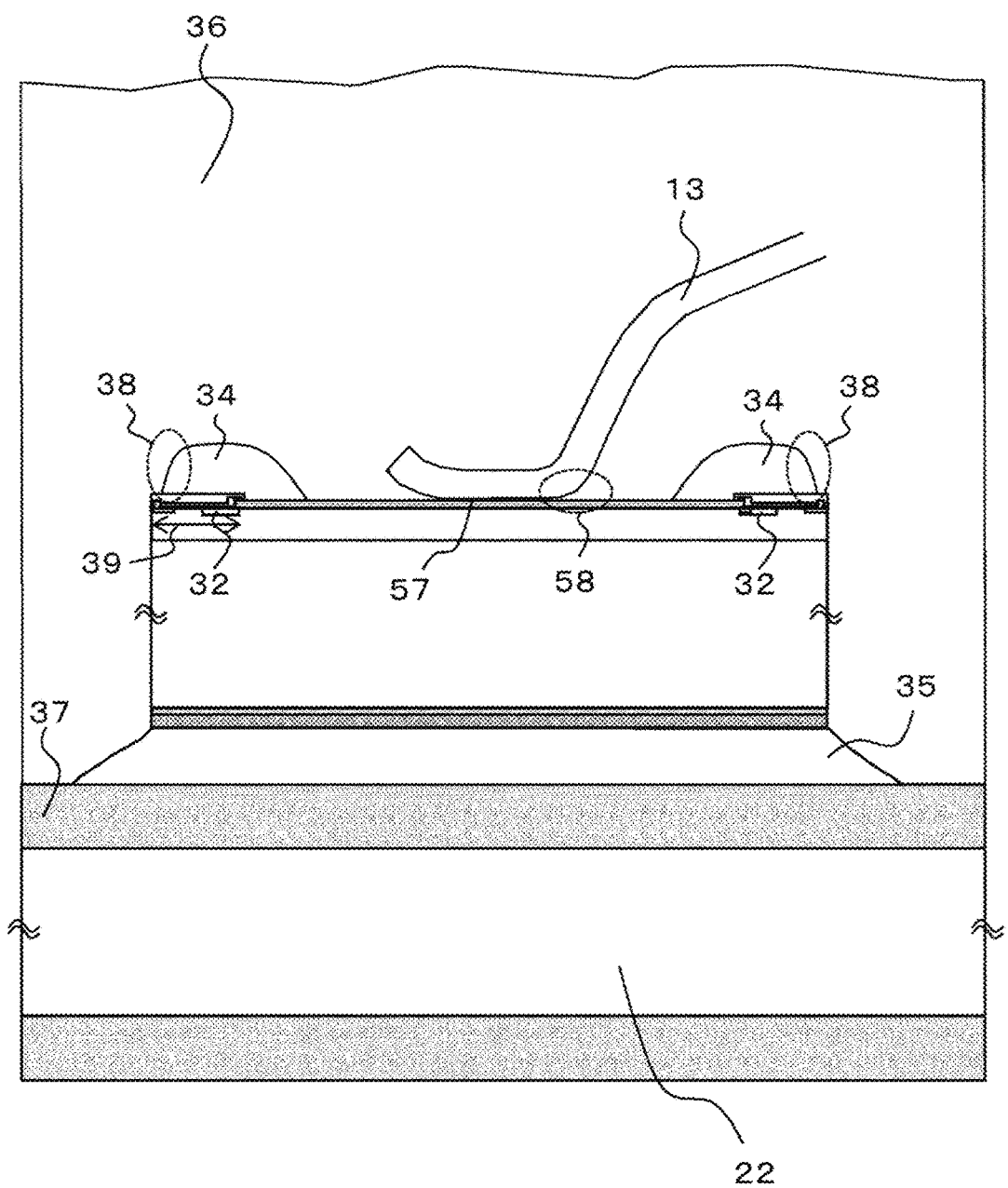
FIG. 5 is a view illustrating a mounting state according to the prior art.
Figure 8:
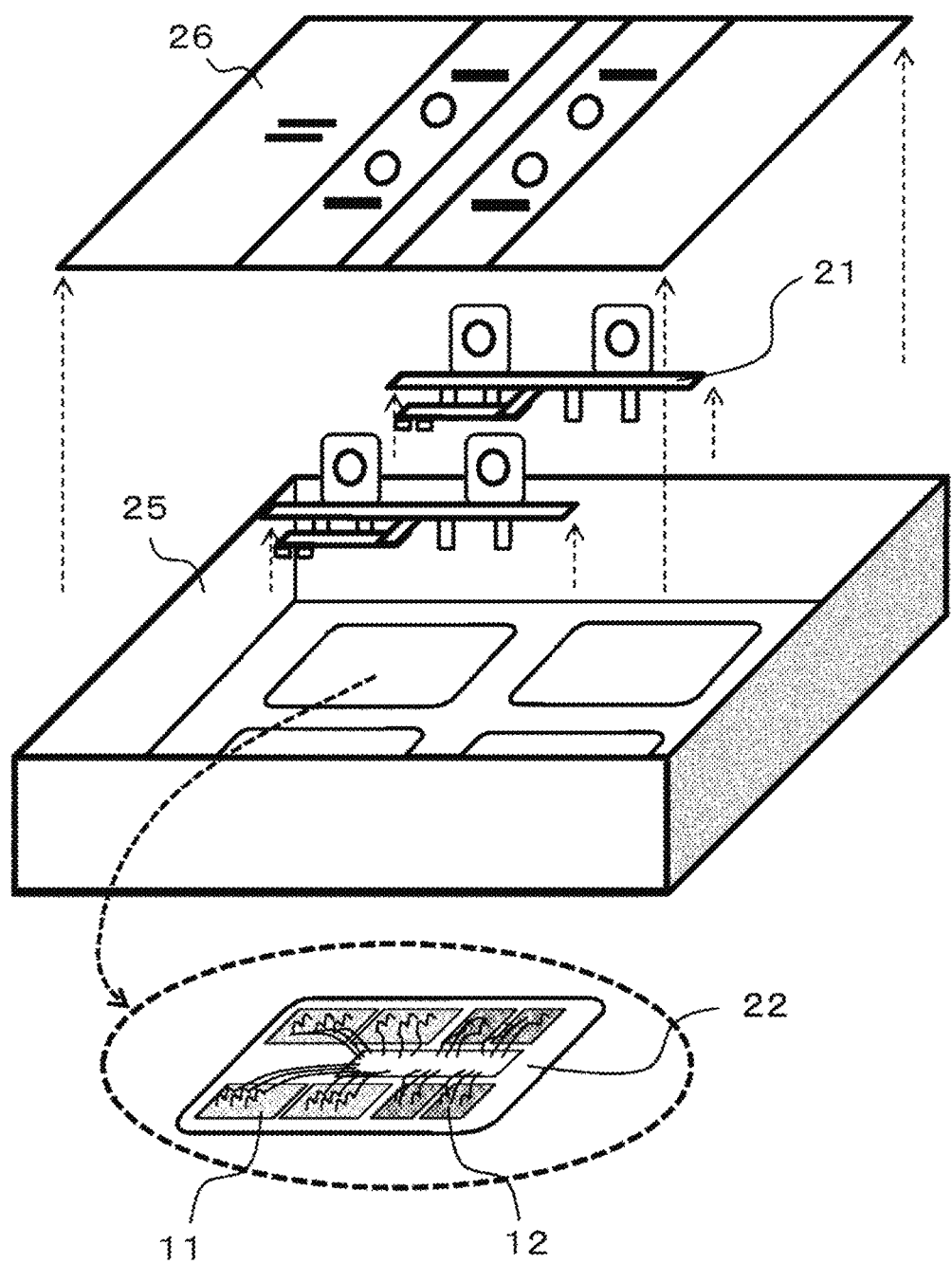
FIG. 8 is a perspective view illustrating an appearance and an internal configuration of a semiconductor module according to the first embodiment of the present invention.
Figure 9:
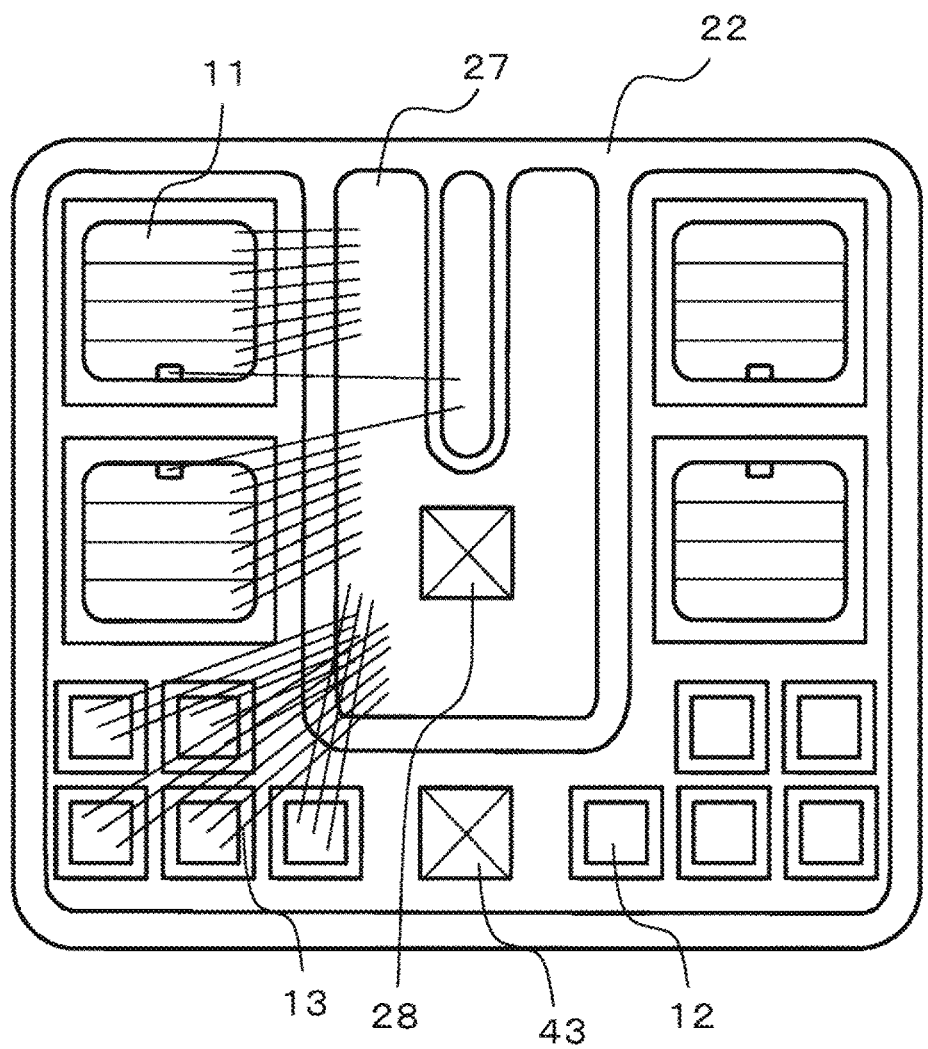
FIG. 9 is an enlarged view of an insulating substrate to be mounted on the semiconductor module of FIG. 8.

An appearance and an internal configuration of the semiconductor module are as illustrated in FIG. 8, and four insulating substrates 22 are mounted in the semiconductor module. An enlarged view of the insulating substrate 22 is illustrated in FIG. 9. On the one insulating substrate 22, four Si-IGBT chips 11 and ten SiC-SBD chips 12 are mounted. An enlarged view of the SiCD-SBD is as illustrated in FIG. 2, and a termination region 32 is disposed outside an electrode 31 of an anode. A highly electric field resistant sealing material is formed so as to completely cover the termination region 32. As illustrated in FIG. 5, a chip including the termination region 32 and the insulating substrate 22 are sealed by silicone gel 36 inside a case.

Figure 6:
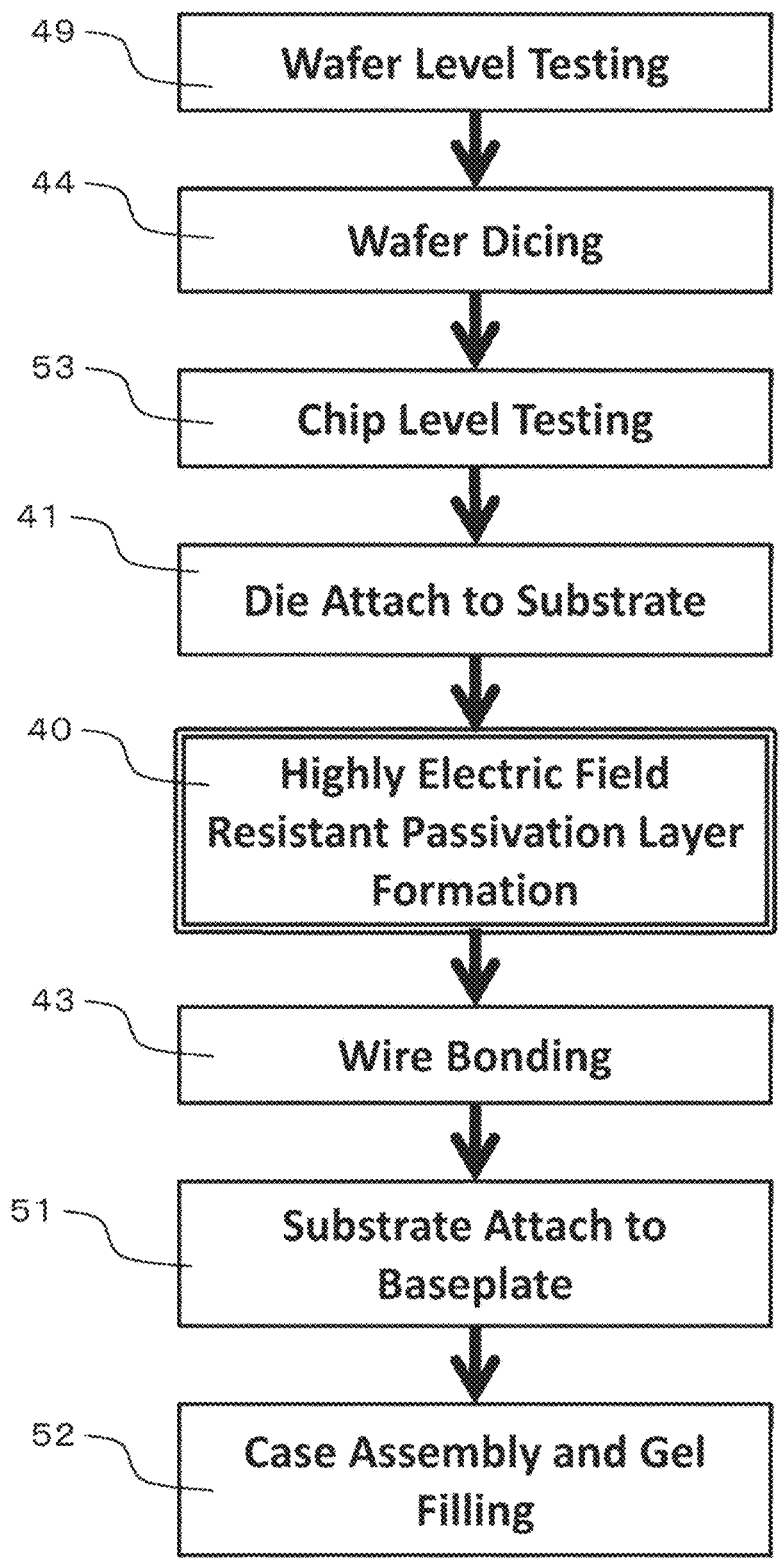
FIG. 6 illustrates a flow of a coating step of a highly electric field resistant sealing material in the prior art.
Figure 7:
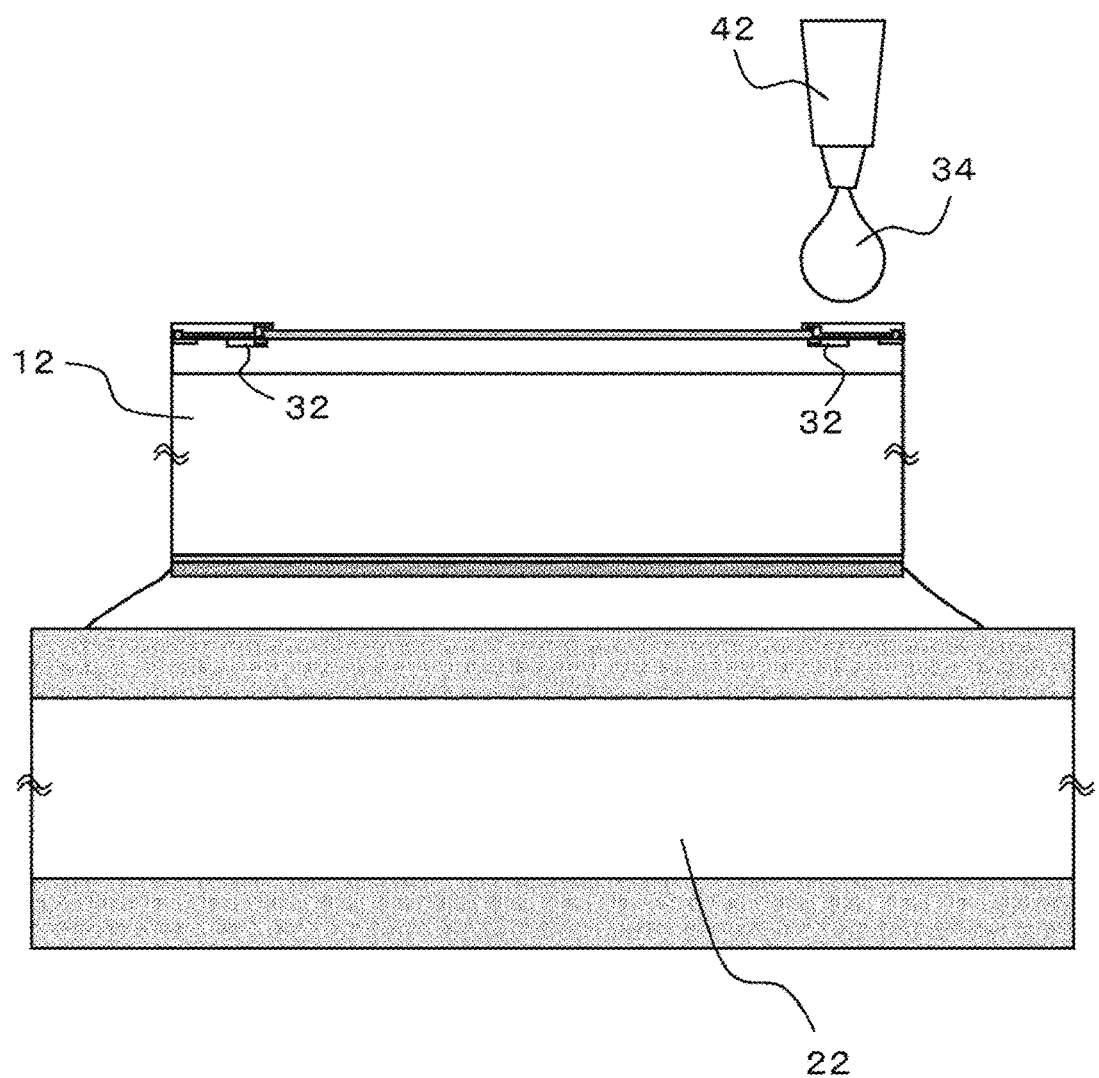
FIG. 7 is a view illustrating the coating step according to the prior art.
Figure 10:
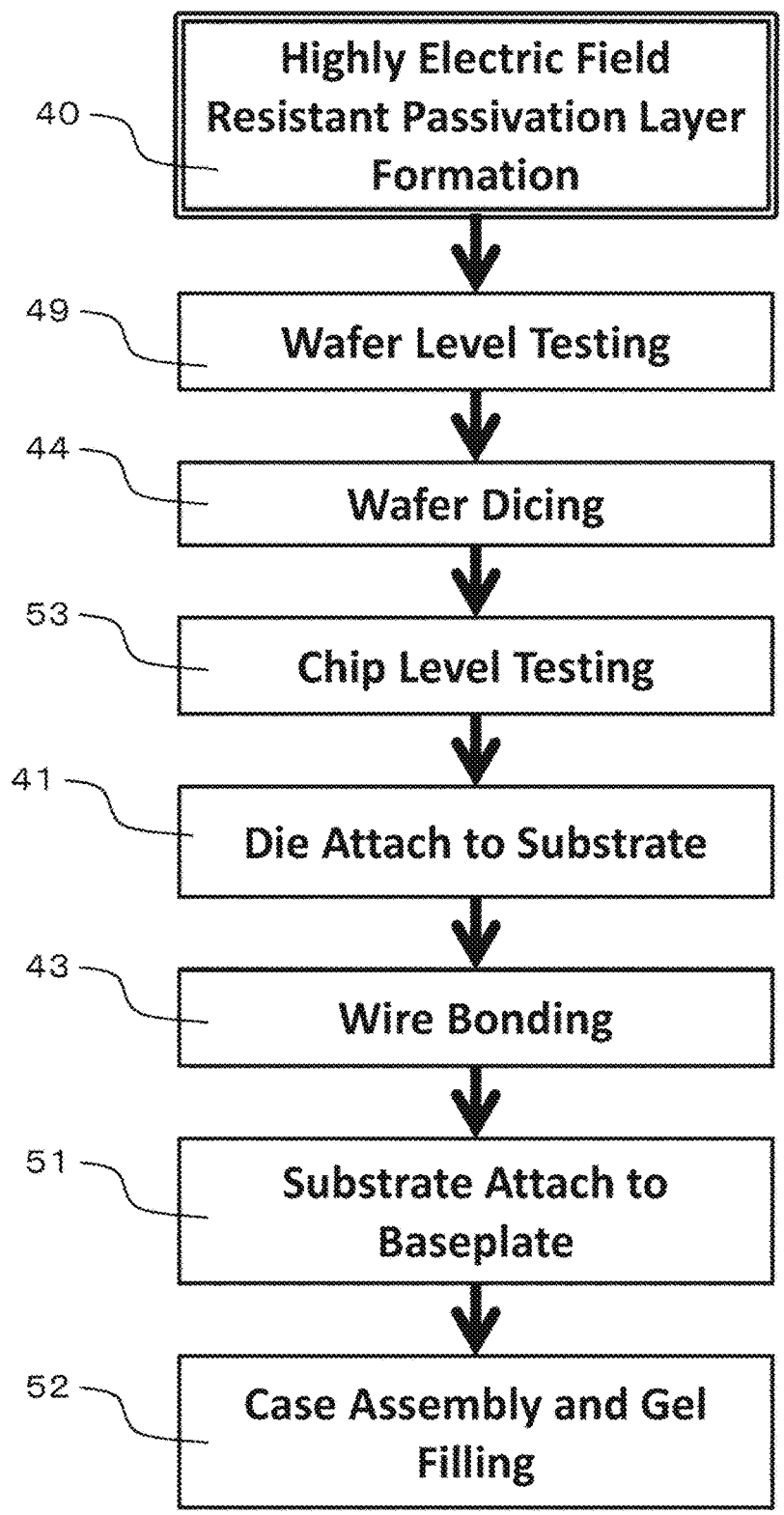
FIG. 10 is illustrates a flow of major steps including a formation step of the highly electric field resistant sealing material in a method for manufacturing a semiconductor device according to the first embodiment of the present invention.
Figure 11:
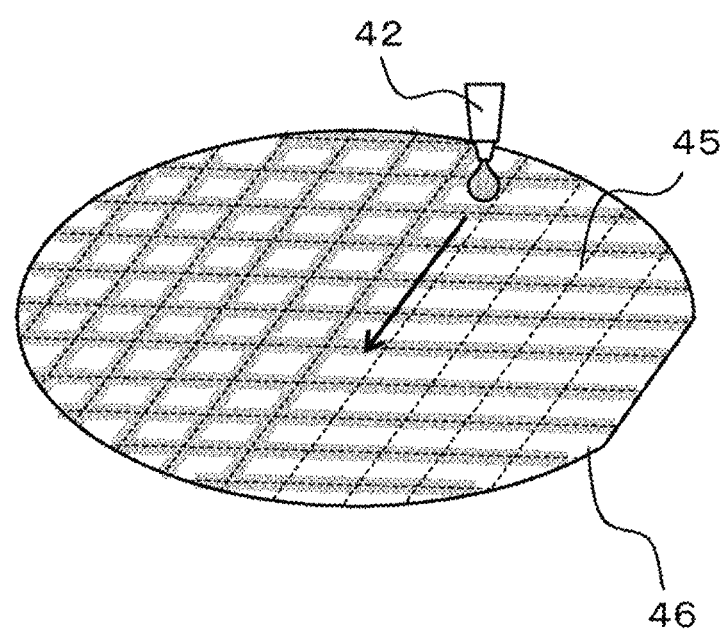
FIG. 11 is a view illustrating a state of the formation step of the highly electric field resistant sealing material in the method for manufacturing a semiconductor device according to the first embodiment of the present invention.

FIG. 10 illustrates a flow of major steps including a formation step of the highly electric field resistant sealing material. In the manufacturing method of the present invention, the formation step of the highly electric field resistant sealing material is moved from between a mounting step 41 of a chip on an insulating substrate and a wire bonding step 43 illustrated in the prior art (FIG. 6) to before a dicing step 44 of a wafer. A formation step 40 of the highly electric field resistant sealing material is schematically illustrated in FIG. 11. The highly electric field resistant sealing material 34 is formed on a scribe line 45 in a wafer state. The highly electric field resistant sealing material 34 is formed by coating the paste-like highly electric field resistant sealing material 34 in a lattice shape by a dispenser. In a conventional method, since alignment of each chip such as chip inclination or an in-plane position, rotation, and the like is shifted due to variations in soldering, a highly accurate position correction technique was required for the dispenser that performs coating. Since a coating amount is sensitive to a distance between a nozzle and an object, the dispenser had, in addition to a function of correcting the in-plane position of the nozzle by image recognition, a function of detecting a distance to the chip by a sensor and correcting the inclination to perform coating. In the method described herein, however, the entire wafer is aligned only once at the beginning, and after that, just by properly recognizing the in-plane position with an image, it is possible to perform coating with the same accuracy without requiring a height adjustment function. Accordingly, a cost of a coating device can be reduced, and an effect of shortening a manufacturing time can be obtained since recognition time and a time required for the each chip for nozzle movement in a coating step are reduced.

After the highly electric field resistant sealing material is coated, heat treatment for curing is performed. After curing is performed under heat treatment conditions similar to those in the prior art of: (1) at 100° C. for 30 minutes; and (2) at 200° C. for 1 hour, additional high-temperature heat treatment is performed under a condition of: (3) in an inert atmosphere, at 300° C. for 1 hour. By performing the additional heat treatment, degassing can be suppressed also in high-temperature heat treatment (at 355° C. at maximum) in a subsequent chip mounting step. A relationship between the heat treatment and the degassing can be evaluated by, for example, a TDS apparatus (thermal desorption gas analyzer). The degassing is reduced by performing the treatment at a temperature which was not used conventionally, that is, 200° C. or higher. In addition, a maximum temperature may be equal to or lower than a maximum temperature of the subsequent chip mounting step, and in a case where the maximum temperature is 400° C. or lower, it is within a range of resistance of the highly electric field resistant sealing material.

Figure 12:
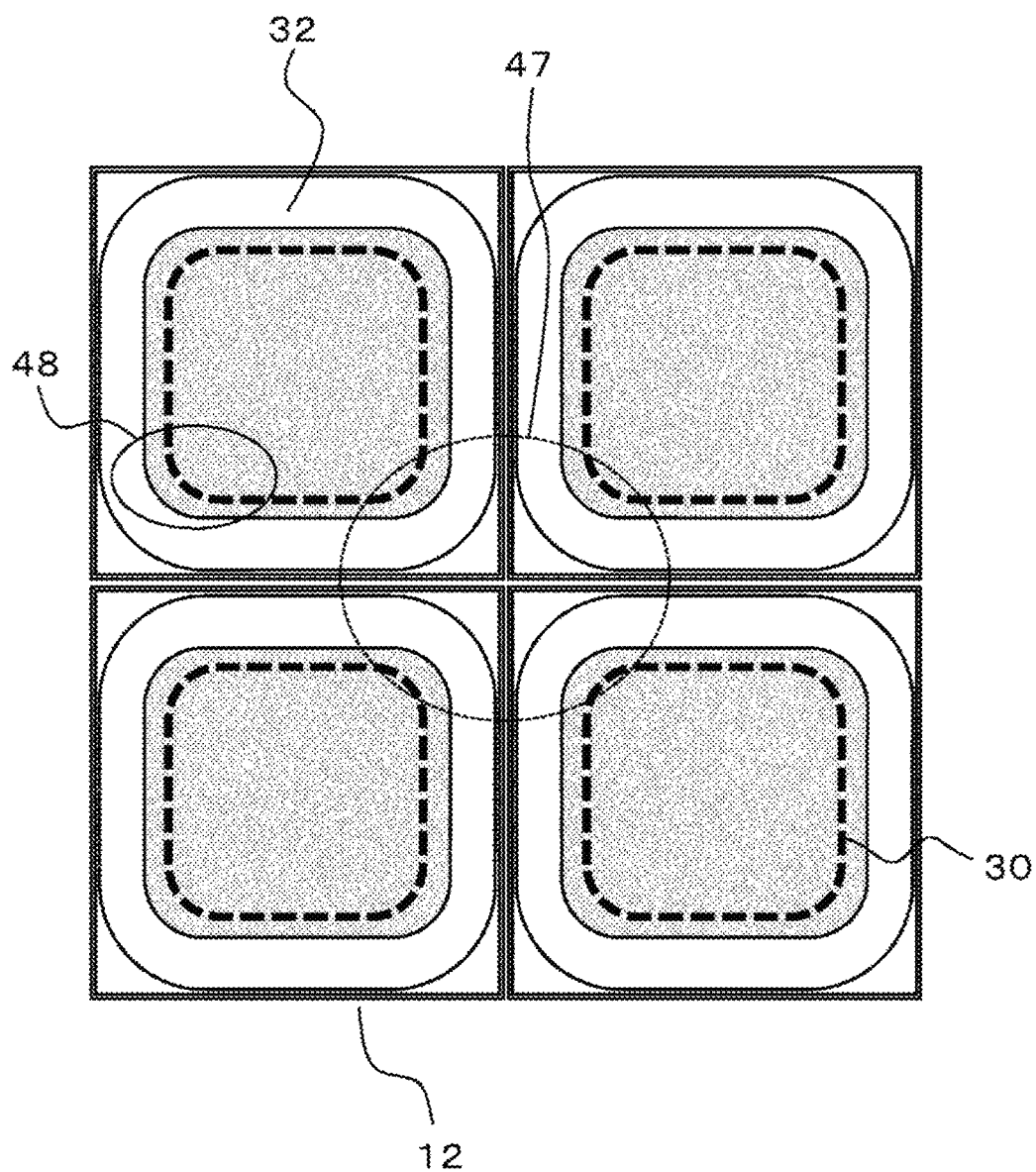
FIG. 12 is a view illustrating the formation step of the highly electric field resistant sealing material in the method for manufacturing a semiconductor device according to the first embodiment of the present invention.

The coating of the highly electric field resistant sealing material is performed in a lattice shape along the scribe line of the wafer, so that an excess sealing material spreads at an intersection portion 47 of a lateral direction and a longitudinal direction as illustrated in FIG. 12, to effectively cover a corner portion 48 of the termination region.

Figure 13:
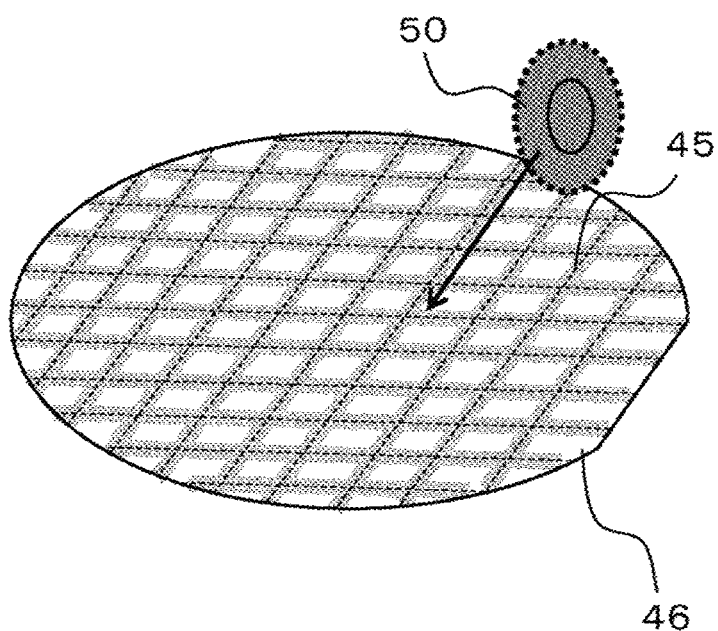
FIG. 13 is a view illustrating a dicing step of a wafer in the method for manufacturing a semiconductor device according to the first embodiment of the present invention.

After performing thermal curing, a characteristic test step 49 in the wafer state is performed. Here, as described above, since discharge to atmosphere is suppressed by covering the termination region having a strong electric field intensity with the highly electric field resistant sealing material 34, a high voltage application test can be carried out easily. FIG. 13 schematically illustrates a dicing step of the wafer on which curing was performed along the scribe line.

Subsequently, a characteristic test in a chip state is carried out, and the step proceeds to a bonding step (41 in FIG. 10) of the chip to the insulating substrate. Since the chip is bonded using high temperature solder here, heat treatment is performed in a reducing atmosphere at 355° C. at maximum. Then, the step 43 of performing wire bonding on an electrode of the bonded chip is performed. Next, after performing a step 51 of bonding the insulating substrate to a baseplate to be a bottom surface of a module to be connected to a heat sink, and a set of module assembly steps 52 such as case adhesion and gel encapsulation, an assembly step of an SiC hybrid power module of the present invention is completed.

Here, to describe in more detail a shape of the highly electric field resistant sealing material, which is a feature of the present invention, description will be given below with reference to FIGS. 14 to 16.

Figure 14:
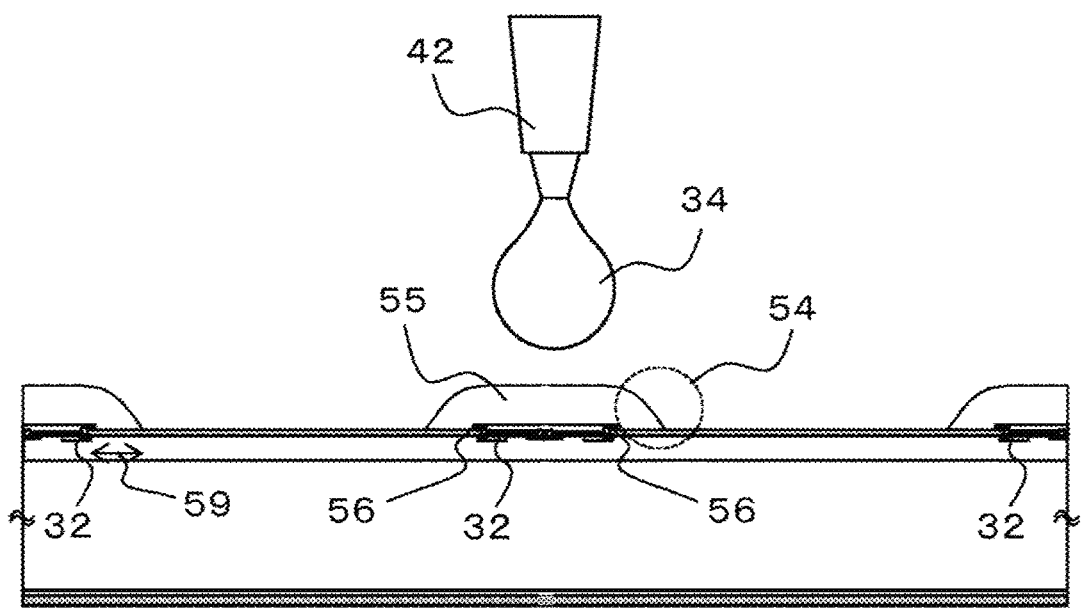
FIG. 14 is an enlarged cross-sectional view illustrating the formation step of the highly electric field resistant sealing material in a wafer state in the method for manufacturing a semiconductor device according to the first embodiment of the present invention.

FIG. 14 is an enlarged cross-sectional view illustrating the formation step of the highly electric field resistant sealing material in the wafer state. In a case where the highly electric field resistant sealing material 34 discharged from a coating nozzle 42 of the dispenser is coated on the termination region 32 on the wafer, the paste-like highly electric field resistant sealing material slightly expands to form a tapered shape 54 in which a film thickness at both ends gradually becomes thin, to have a shape indicated by 55 in FIG. 14.

A merit of forming the tapered shape 54 toward an inner periphery of the chip is as follows. First, since the electrode 31 is an equipotential surface, an electric field from the termination region 32 spreads around an electrode terminal boundary 56 when viewed from the cross-section. Similarly, the tapered shape 54 in which a film of the highly electric field resistant sealing material is formed over a nearly constant distance from the electrode terminal boundary 56 is an ideal shape without waste. For example, even in a case where a bonding portion (57 in FIG. 5) by the wire bonding approaches an electrode end portion due to positional displacement, a rising portion of a heel 58 of the bonding portion hardly interferes with the highly electric field resistant sealing material. In addition, there is a large merit that since the tapered shape is determined by coating conditions and a boundary is automatically formed, an additional patterning step is not required inside the electrode end. Since the chips mounted on the insulating substrate are misaligned both in an in-plane direction and in a height direction, it is difficult to perform accurate patterning. Additionally, the accurate patterning is difficult to be performed also because a common photolithography step applied to a film having a thickness of at most about 10 μm is difficult to be applied to the highly electric field resistant sealing material, since the film thickness of the highly electric field resistant sealing material is typically as large as 80 μm.

Although a skirt portion of the tapered shape is required to overlap the electrode 31 so as to cover an electrode end portion 56 having high electric field intensity, in a case where an overlap length 59 is too long, a region required for performing the wire bonding is insufficient. Therefore, the coating conditions of the highly electric field resistant sealing material are set so that the overlap length 59 falls within a range not more than 1 mm as a reference.

The coating conditions of the highly electric field resistant sealing material can be adjusted to a range where a desired coating film thickness and a coating line width can be obtained using, as parameters, a nozzle diameter, a discharge pressure, a gap length (distance between the nozzle and an object to be coated), coating speed (in-plane moving speed of the nozzle) of the dispenser, and a temperature of the highly electric field resistant sealing material as the coating material. Note that even in a case where these conditions are adjusted, the film thickness may not reach the desired film thickness in some cases since in a high pressure product having a withstand voltage of 3.3 kV-class or more in the present embodiment, for example, an internal electric field is high and a required film thickness of the highly electric field resistant sealing material is thicker than that of a general coating material. In that case, the film thickness can be increased by a method of coating the highly electric field resistant sealing material several times. Specifically, after the coating in the above-mentioned method, temporary curing in atmosphere may be performed under a heat treatment condition at a temperature of 60° C. lower than usual, and then a second coating may be performed. These steps may be repeated also in a case where coating is performed 3 times or more. This makes it possible to perform coating of a thick film so that the film has a thickness which cannot be attained in a single step, although the number of steps increases.

Figure 15:
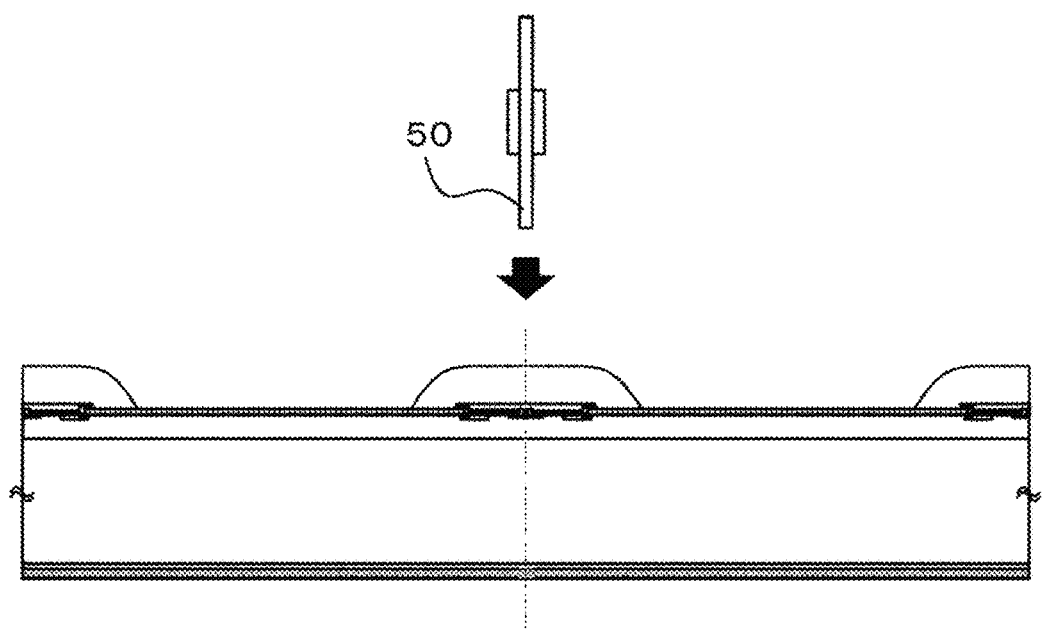
FIG. 15 is an enlarged cross-sectional view illustrating a state immediately before dicing in a dicing step of a chip in the method for manufacturing a semiconductor device according to the first embodiment of the present invention.
Figure 16:
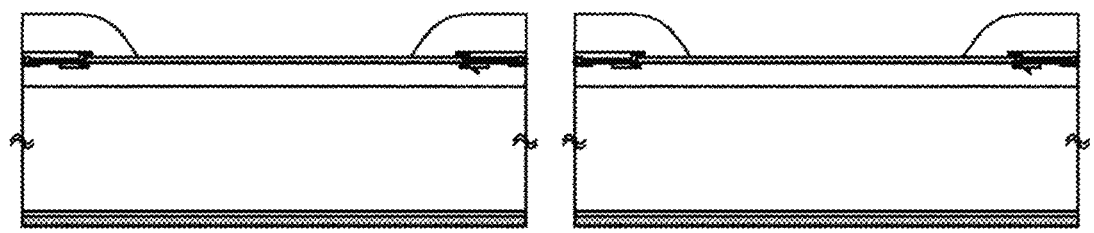
FIG. 16 is an enlarged cross-sectional view illustrating a state immediately after dicing in the dicing step of the chip in the method for manufacturing a semiconductor device according to the first embodiment of the present invention.

Next, in a case where dicing of the chip is performed by a dicing blade 50 as illustrated in FIG. 15, the chip is cut together with the highly electric field resistant sealing material 34 as illustrated in FIG. 16. A final cross-sectional shape of the chip is illustrated in FIG. 1 The highly electric field resistant sealing material 34 has a substantially perpendicular cross-sectional shape at a chip outer peripheral portion, and a state where the film thickness is substantially maximum is maintained up to a chip outer peripheral end portion. This is important for a design of the termination region 32. Since electric field intensity of a narrow termination region which can improve an area efficiency is high up to the vicinity of the chip outer peripheral end, in a conventional structure illustrated in FIG. 5 in which the film thickness of the highly electric field resistant sealing material at the outer peripheral end portion is thin, the electric field intensity exceeds a limit of dielectric breakdown field intensity permitted by a material in the sealing material such as the silicone gel to be disposed in an upper layer. To realize the narrow termination region that can make use of excellent physical properties of a wide band gap semiconductor such as SiC, the film thickness of the highly electric field resistant sealing material is required to be maintained thick up to the chip outer peripheral end portion in the shape illustrated in FIG. 1.

Figure 17:
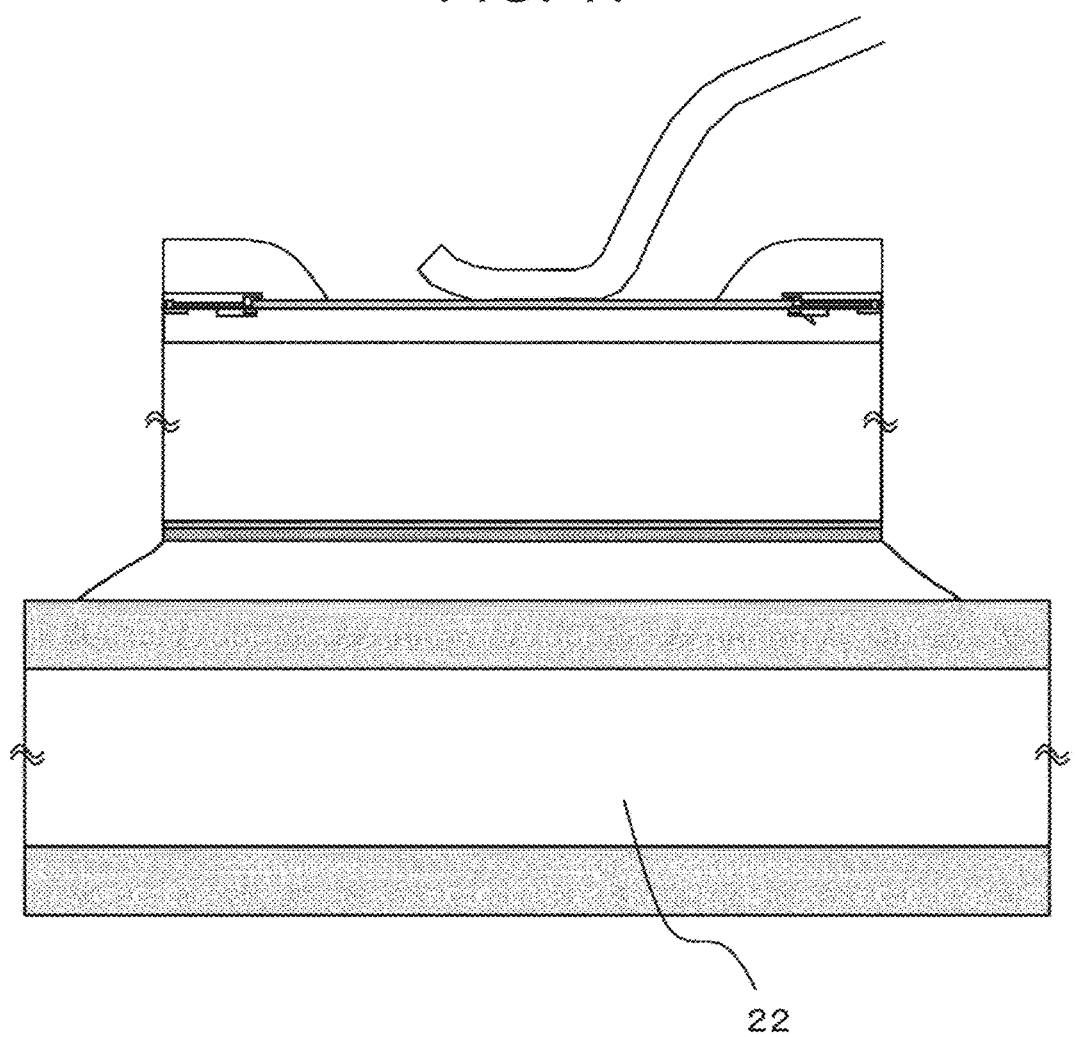
FIG. 17 is a cross-sectional view of the semiconductor device at a stage where wire bonding is performed by the method for manufacturing a semiconductor device according to the first embodiment of the present invention.

FIG. 17 illustrates a cross-section at a stage where the wire bonding is performed on the electrode of the chip bonded to the insulating substrate 22.

Figure 18:
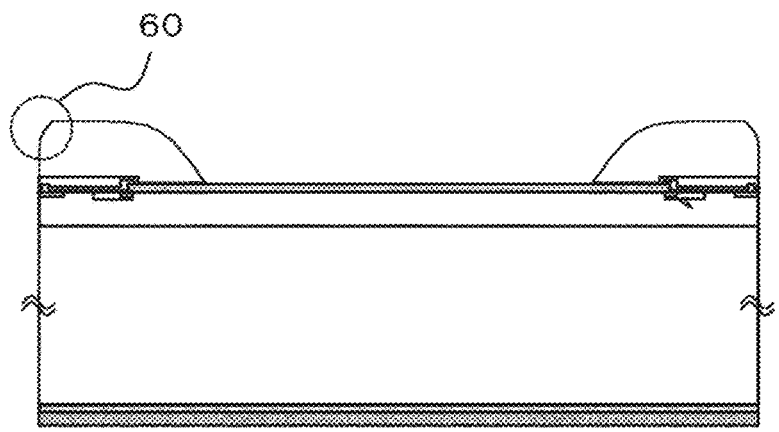
FIG. 18 is a cross-sectional view of the semiconductor device in a case where a part of the highly electric field resistant sealing material according to the first embodiment of the present invention has a recessed shape.
Figure 19:
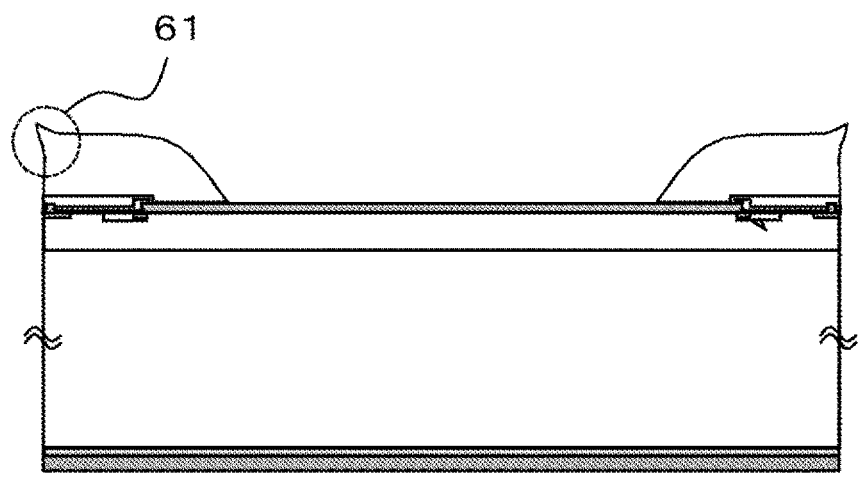
FIG. 19 is a cross-sectional view of the semiconductor device in a case where a part of the highly electric field resistant sealing material according to the first embodiment of the present invention has a projected shape.

In forming the highly electric field resistant sealing material, at least a part of the cross-section has an end face shape perpendicular or substantially perpendicular at the chip outer peripheral end portion, so that it is possible to perform sealing corresponding to a high electric field up to the vicinity of the chip outer peripheral end portion. From this viewpoint, a similar effect can be obtained even in a case where a part of an upper portion of the cross-sectional shape of the highly electric field resistant sealing material is a recessed shape 60 as illustrated in FIG. 18, or a projected shape 61 as illustrated in FIG. 19. Although the recessed shape or the projected shape in FIG. 18 or 19 are mainly determined by a relationship between strength of thermal curing conditions of the highly electric field resistant sealing material and dicing conditions (such as blade rotation speed and moving speed), the shape may be optimized considering other factors such as adhesiveness between the highly electric field resistant sealing material and the chip after the dicing.

Figure 20A:
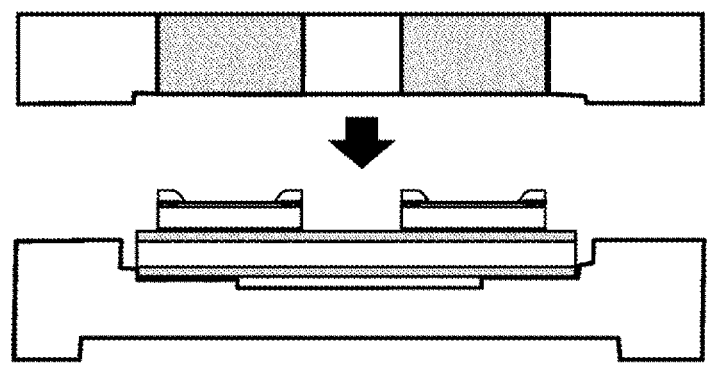
FIG. 20A is a view illustrating a state before the highly electric field resistant sealing material in the first embodiment of the present invention is fixed to a carbon jig.
Figure 20B:
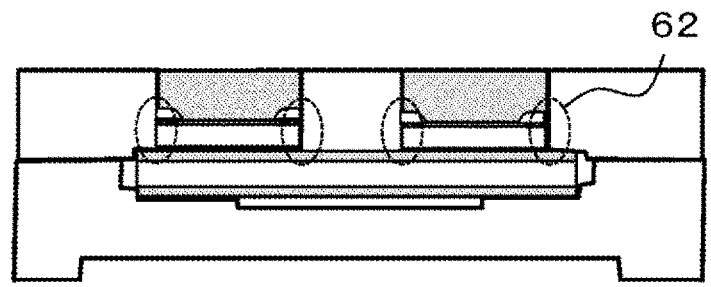
FIG. 20B is a view illustrating a state where the highly electric field resistant sealing material in the first embodiment of the present invention is fixed to the carbon jig.

In some cases, the chip on which the highly electric field resistant sealing material is formed causes problems depending on a subsequent bonding method of the chip to the insulating substrate. Here, because high temperature lead solder is used for bonding, solder is reflowed by heat treatment at 355° C. at maximum by a hydrogen reduction furnace for bonding. However, a side surface of a carbon jig that fixes the chip to an appropriate position on the insulating substrate and the highly electric field resistant sealing material at an chip end portion are fixed in some cases. This state is shown in FIGS. 20*a* and 20*b*. FIG. 20*a* illustrates a state before the highly electric field resistant sealing material is fixed to the carbon jig, and FIG. 20*b* illustrates a state where the highly electric field resistant sealing material is fixed to the carbon jig. The fixing occurs at a contact portion 62 of the carbon jig and the highly electric field resistant sealing material at a chip end surface.

Figure 21:
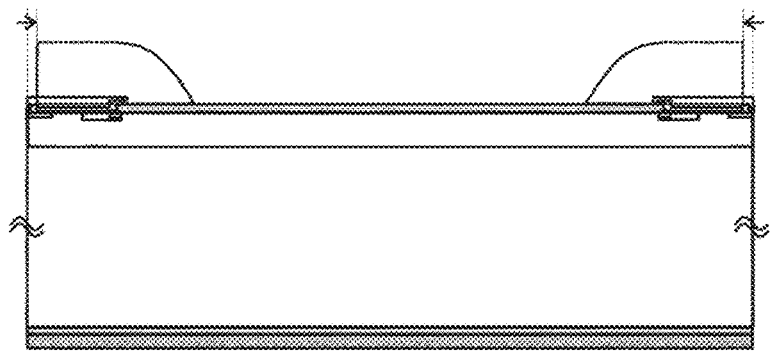
FIG. 21 is a view illustrating a structure of the semiconductor device in which the highly electric field resistant sealing material in the first embodiment of the present invention is avoided to be fixed to the carbon jig.

The fixing can be prevented by avoiding contact between the carbon jig and the highly electric field resistant sealing material at the chip end surface. Therefore, the problem can be solved by adopting a structure illustrated in FIG. 21 to the cross-section at the chip outer peripheral end. An outer peripheral end surface is recessed from the chip end to an extent not to affect an original purpose of relaxing a high electric field, that is, by a small amount of 150 μm or less, which is at most one third of the width of the termination region serving as an electric field relaxation region, preferably 30 μm. To realize the structure of FIG. 21, there is a method in which two types of dicers with different blade widths are used in the dicing of the chip, and shallow dicing is performed first until reaching a wafer surface with a wide blade (100 μm), and then a center is cut to the end with a narrow blade (50 μm). Alternatively, after the dicing of the chip, light etching is performed on the highly electric field resistant sealing material using a solvent such as N-methyl-2-pyrrolidone (NMP) or asking is performed using oxygen plasma or the like, so that a desired shape can be formed by isotropically forming a recess on a surface of the highly electric field resistant sealing material. In either method, the problem of the fixing can be prevented as long as a gap is formed to avoid contact between the chip end portion and an inner wall of the carbon jig.

Figure 22:
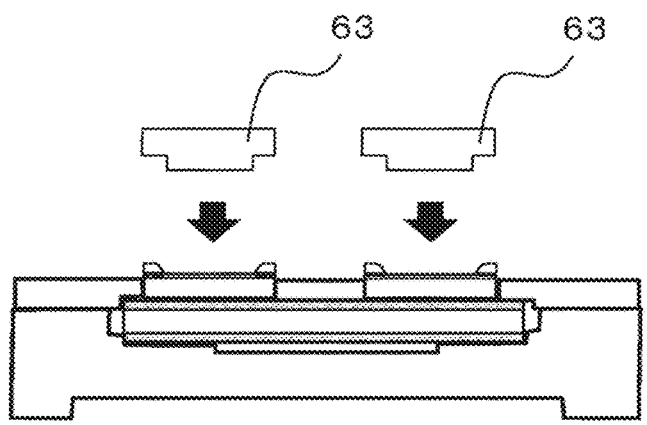
FIG. 22 is a view illustrating a structure of the carbon jig in which the highly electric field resistant sealing material in the first embodiment of the present invention is avoided to be fixed to the carbon jig.

The formation of a recess portion as described above is unnecessary in the case of solderless bonding in which solder and a high-temperature heat treatment furnace are not used for bonding the chip and the insulating substrate. However, in the solderless bonding, it is necessary to pressurize the chip and the insulating substrate both in a bonding method using sintered silver, and in a method in which a bonding surface is cleaned with an ion beam or the like and bonded in high vacuum. At this time, the highly electric field resistant sealing material may be an obstacle to pressurization from the upper surface. To prevent this, irregularity 63 illustrated in FIG. 22 may be provided so that a pressure jig does not contact a forming portion of the highly electric field resistant sealing material.

The highly electric field resistant sealing material including one or a plurality of polyamide imide resin, polyether amide imide resin, and polyether amide resin is used. Here, a combination of the polyether amide resin and the polyimide resin was adopted. In this case, dielectric breakdown field intensity of the highly electric field resistant sealing material is 230 kV/mm, which means that the highly electric field resistant sealing material has characteristics of the dielectric breakdown field intensity 10 times or more of that of the silicone gel. In addition, viscosity of resin was adjusted within a range in which the resin gets pasty to be coated in a desired film thickness.

Figure 23:
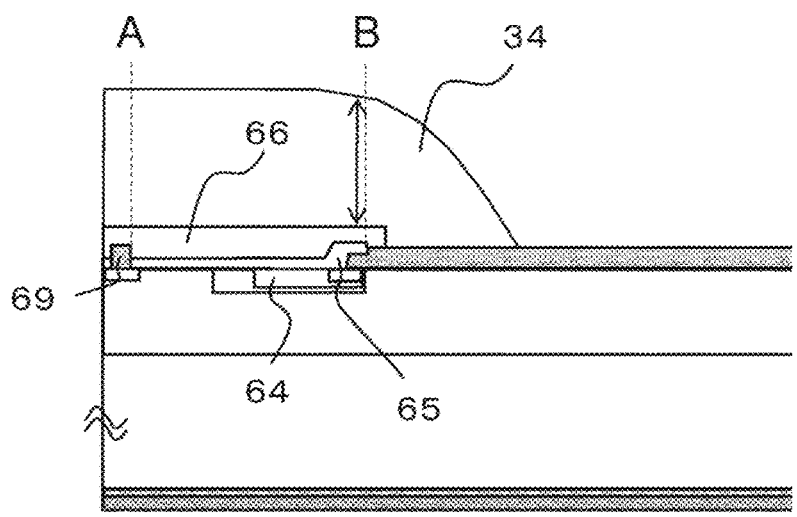
FIG. 23 is an enlarged view illustrating a structure in the vicinity of a termination region of a semiconductor chip in the first embodiment of the present invention.
Figure 24:
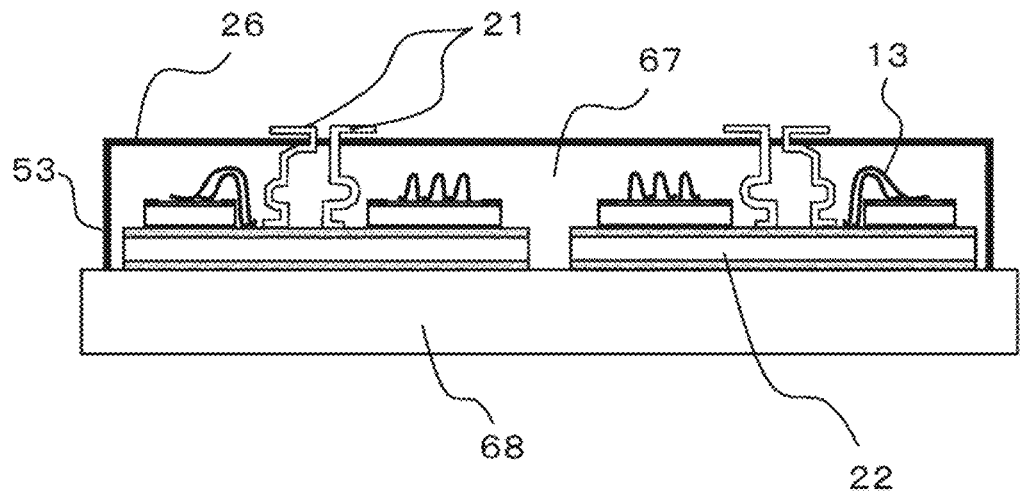
FIG. 24 is a cross-sectional view illustrating a case and interior thereof in the first embodiment of the present invention.

In the present embodiment, an SiC-SBD having a withstand voltage of 3.3 kV is used. Specifically, in a configuration of the chip on the termination region, as illustrated in FIG. 23, an $SiO_2$ film 65 is formed on a p-type impurity region 64 of SiC, and a polyimide film 66 is formed thereon as a protective film to have a thickness of 4 to 8 μm. The highly electric field resistant sealing material 34 is laminated and formed further thereon. In a cross-sectional view of a case illustrated in FIG. 24, in order not to exceed dielectric breakdown field intensity of the silicone gel (14 kV/mm) by an electric field from an SiC-SBD chip in the silicone gel sealing a remaining space 67 in the case, the film thickness of the highly electric field resistant sealing material 34 on the termination region is required to be at least 50 μm, preferably 80 μm or more between points A and B in FIG. 23 covering a main region. On the other hand, it is preferable that the film thickness of the highly electric field resistant sealing material is set to be 500 μm or less, since in a case where it is too thick, stress increases and problems such as cracks occur.

Note that, although the present embodiment is directed to a high pressure product having a withstand voltage of 3.3 kV, in a medium withstand pressure product having a withstand voltage of 1.7 kV or 1.2 kV, a lower limit of the film thickness of the highly electric field resistant sealing material can be relaxed to be at least 20 μm, though it depends on a design of the termination region.

In the laminated polyimide film 66 and the highly electric field resistant sealing material 34, a relative permittivity of polyimide of the protective film is approximately 2.9, and a relative permittivity of polyetheramide of a main component of the highly electric field resistant sealing material is approximately 3.2. Both of the relative permittivities are smaller than a relative permittivity of 3.8 to 4.1 of the underlying inorganic material layer $SiO_2$ film 65, and larger than a relative permittivity of about 2.7 of the silicone gel 36 to be an upper layer sealing material. These relationships are defined as: the relative permittivity of the underlying layer $SiO_2$ film≥the relative permittivities of the protective film and the highly electric field resistant sealing material ≥the relative permittivity of the silicone gel to be the upper layer sealing material. By setting a relationship in which difference in the relative permittivities is small, an influence due to accumulation of a charge is suppressed.

Second Embodiment

As a second embodiment of the present invention, a structure of a full SiC module and a method for manufacturing the same will be described, the full SiC module including SiC-MOSs as a switching element group and SiC-SBDs as a diode element group, the SiC-MOSs and the SiC-SBDs having a withstand voltage of 3.3 kV and a current capacity of 1200 A, being mounted on the full SiC module.

Figure 25:
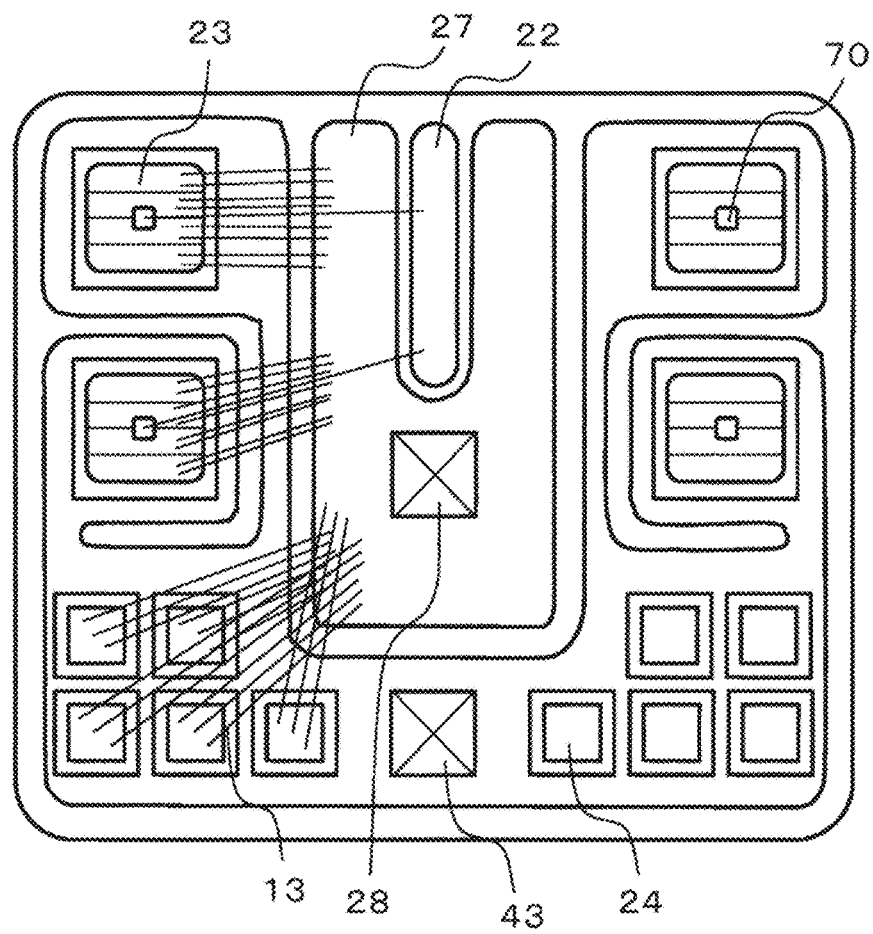
FIG. 25 is an enlarged view of an insulating substrate in a semiconductor device using an SiC-MOS which is a semiconductor device according to a second embodiment which is one representative embodiment of the present invention.
Figure 26:
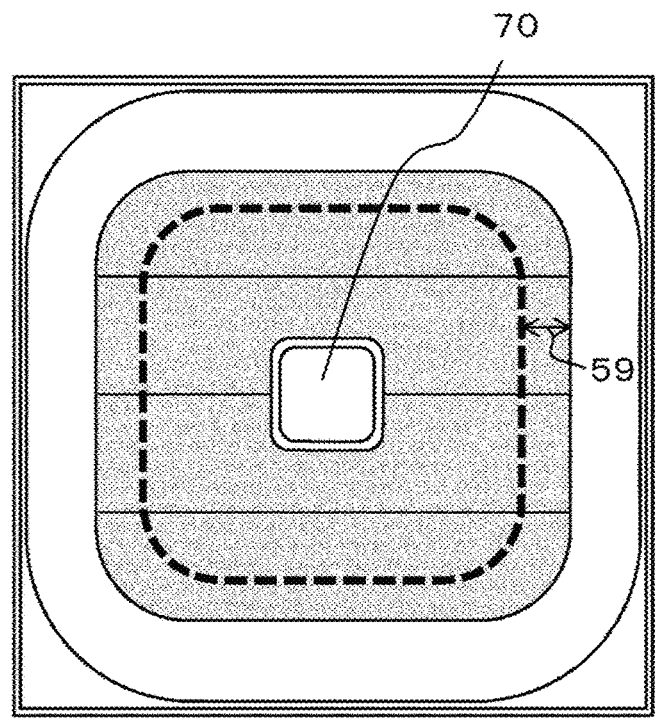
FIG. 26 is an enlarged view of the SiC-MOS, in which a gate electrode pad in the second embodiment of the present invention is disposed at a center.
Figure 27:
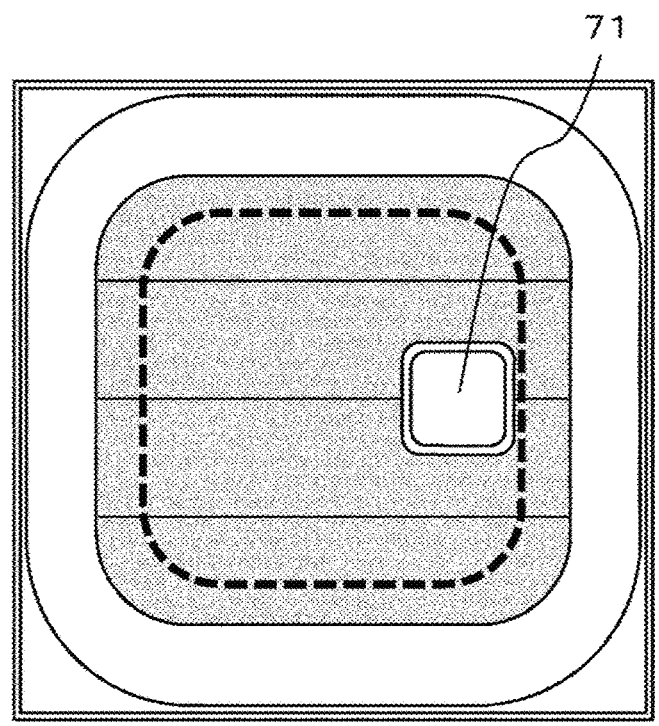
FIG. 27 is an enlarged view of the SiC-MOS, in which the gate electrode pad in the second embodiment of the present invention is disposed closer to an electrode end portion.

An appearance and a case structure of the module are omitted since they are equivalent to those in the first embodiment, and layout of an insulating substrate is illustrated in FIG. 25, and an upper surface of an SiC-MOS chip is illustrated in FIG. 26. In the SiC-MOS, presence of a gate electrode pad 70 is different from the SiC-SBD. To improve layout efficiency in consideration of wiring and the like, it has been a common practice to dispose a pad for a gate at an end portion or a corner of an electrode. However, in a case where a termination region is reduced in forming a highly electric field resistant sealing material, a gate pad is covered by an overlap length 59 to an electrode of the highly electric field resistant sealing material, which causes inconvenience in wire bonding. To solve this problem, the gate pad is separated from an electrode end by 1 mm or more. In FIG. 26, the gate electrode pad 70 is disposed at a center in consideration of equalization of a gate wiring. To minimize an ineffective area due to the gate electrode pad, a gate electrode pad 71 may be disposed closer to the electrode end portion as layout illustrated in FIG. 27.

Since subsequent manufacturing method and configurations of other parts are equivalent to those in the first embodiment, description thereof will be omitted. Further, as a modification of the present embodiment, a configuration of the full SiC module including only the SiC-MOS using a built-in diode of the SiC-MOS while omitting the SiC-SBD can also be applied.

Although representative embodiments of the present invention have been described above, the essence of the present invention lies in a structure and a manufacturing method in which a highly electric field resistant sealing material used for a semiconductor chip using a wide bandgap semiconductor is formed with a necessary film thickness up to a chip end portion. In that sense, the present invention is not limited only to the SiC hybrid module which is a combination of the Si-IGBT and the SiC-SBD, or the full SiC module in which the SiC-MOS is used alone or in combination with the SiC-SBD, but also effective for a technique using a wide bandgap semiconductor such as SiC, GaN, and diamond and for a combination of these with a semiconductor having a general bandgap such as silicon, gallium arsenide, and germanium, and further effective for other techniques combining elements such as a Schottky barrier diode, a PN diode, an MOS, a JFET, a bipolar transistor, and an IGBT.

REFERENCE SIGNS LIST

11 Si-IGBT
12 SiC-SBD 13 wire (bonding)
21 electrode main terminal
22 insulating substrate
25 case
26 cover
27 common emitter (source) circuit pattern
28 common emitter (source) main terminal contact
30 formation region of highly electric field resistant sealing material
31 electrode
32 termination region
33 chip outer peripheral portion
34 highly electric field resistant sealing material
35 solder
36 silicone gel
37 circuit wiring metal
38 end portion of highly electric field resistant sealing material
39 width of termination region
40 coating step of highly electric field resistant sealing material
41 bonding step of chip to insulating substrate
42 coating nozzle of dispenser
43 wire bonding step
44 dicing step
45 scribe line
46 wafer
47 intersection portion of lateral direction and longitudinal direction at time of coating
48 corner portion of termination region
49 wafer characteristic test step
50 blade of dicer
51 bonding step of insulating substrate to baseplate
52 a set of module assembly steps such as case adhesion and gel encapsulation
53 chip test step
54 tapered shape
55 coating shape of highly electric field resistant sealing material in wafer state
56 electrode terminal boundary
57 bonding portion of wire bonding
58 heel of wire bonding bonding portion
59 overlap length of highly electric field resistant sealing material on electrode
60 recessed shape of highly electric field resistant sealing material
61 projected shape of highly electric field resistant sealing material
62 contact portion of highly electric field resistant sealing material between carbon jig and chip end surface
63 pressure jig with irregularities
64 p-type impurity region of SiC
65 $SiO_2$ film
66 polyimide film
67 Remaining space in case
68 baseplate
69 channel stopper
70 gate electrode pad disposed at center
71 gate electrode pad disposed closer to electrode end portion

The invention claimed is:

1. A semiconductor device, comprising a semiconductor chip in which a wide gap semiconductor element is formed, wherein a cross-sectional shape of a highly electric field resistant sealing material formed on a metal wiring in a peripheral portion of the semiconductor chip at a pattern surface side of the chip has an end face shape at least in part perpendicular or substantially perpendicular at a chip outer peripheral end side, and a shape in which a film thickness decreases continuously toward an inside at a chip inner peripheral end side; and
wherein the wide gap semiconductor element comprises silicon carbide.

2. The semiconductor device according to claim 1, wherein
the highly electric field resistant sealing material comprises at least one of polyamide imide resin, polyether amide imide resin, and polyether amide resin.

3. The semiconductor device according to claim 1, wherein
the highly electric field resistant sealing material has the film thickness of at least 50 μm and not more than 500 μm.

4. The semiconductor device according to claim 1, wherein
a relative permittivity of the highly electric field resistant sealing material is smaller than a relative permittivity of an underlying inorganic material layer and larger than a relative permittivity of an upper layer sealing material.

5. The semiconductor device according to claim 1, wherein
a portion where the chip outer peripheral end side has at least in part an end face shape perpendicular or substantially perpendicular is recessed from a chip end by at most one third of a width of an electric field relaxation region.

6. A method for manufacturing a semiconductor device comprising a semiconductor chip in which a wide gap semiconductor element is formed, the method comprising the steps of:
forming a highly electric field resistant sealing material on a metal wiring in a peripheral portion of the semiconductor chip on a pattern surface side of the chip in a semiconductor wafer state, such that a cross-sectional shape of the highly electric field resistant sealing material has an end face shape at least in part perpendicular or substantially perpendicular at a chip outer peripheral end side, and a shape in which a film thickness decreases continuously toward an inside at a chip inner peripheral end side;
performing heat treatment on the semiconductor wafer; and
performing dicing on the heat-treated semiconductor wafer;
wherein the wide gap semiconductor element comprises silicon carbide.

7. The method for manufacturing a semiconductor device according to claim 6, wherein
a temperature of the heat treatment is in a range of 200° C. to 400° C.

8. The method for manufacturing a semiconductor device according to claim 6, wherein
the step of forming a highly electric field resistant sealing material includes a step of coating the highly electric field resistant sealing material at least in two directions crossing each other along a scribe line of a wafer.

9. A semiconductor module, comprising a semiconductor chip in which a wide gap semiconductor element is formed, wherein, in the semiconductor chip, a cross-sectional shape of a highly electric field resistant sealing material formed on a metal wiring in a peripheral portion of the semiconductor chip at a pattern surface side of the chip has at least in part an end face shape perpendicular or substantially perpendicular at a chip outer peripheral end side, and a shape in which a film thickness decreases continuously toward an inside at a chip inner peripheral end side; and wherein the wide gap semiconductor element comprises silicon carbide.

10. The semiconductor module according to claim 9, wherein
the highly electric field resistant sealing material comprises at least one of polyamide imide resin, polyether amide imide resin, and polyether amide resin.

11. The semiconductor module according to claim 9, wherein
the highly electric field resistant sealing material has the film thickness of at least 50 µm and not more than 500 µm.

12. The semiconductor module according to claim 9, wherein
a relative permittivity of the highly electric field resistant sealing material is smaller than a relative permittivity of an underlying inorganic material layer and larger than a relative permittivity of an upper layer sealing material.

13. The semiconductor module according to claim 9, wherein
a portion where the chip outer peripheral end side having at least in part an end face shape perpendicular or substantially perpendicular is recessed from a chip end by at most one third of a width of an electric field relaxation region.

* * * * *